(12) United States Patent
Meis et al.

(10) Patent No.: US 8,581,393 B2
(45) Date of Patent: Nov. 12, 2013

(54) THERMALLY CONDUCTIVE LED ASSEMBLY

(75) Inventors: Michael A. Meis, Stillwater, MN (US);
Susan L. Korpela, Woodbury, MN (US);
Jeffrey R. Janssen, Woodbury, MN (US); Patrick J. Hager, Woodbury, MN (US); Ellen O. Aeling, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 559 days.

(21) Appl. No.: 11/756,929

(22) Filed: Jun. 1, 2007

(65) Prior Publication Data

US 2008/0074871 A1    Mar. 27, 2008

Related U.S. Application Data

(60) Provisional application No. 60/826,457, filed on Sep. 21, 2006.

(51) Int. Cl.
*H01L 23/34* (2006.01)

(52) U.S. Cl.
USPC .......................... 257/720; 257/718; 257/294

(58) Field of Classification Search
USPC .......................................... 257/294, 718, 720
See application file for complete search history.

(56) References Cited

U.S. PATENT DOCUMENTS

| | | | |
|---|---|---|---|
| 4,271,408 A | 6/1981 | Teshima | |
| 4,409,981 A | 10/1983 | Lundberg | |
| 4,502,761 A | 3/1985 | Knoll et al. | |
| 4,542,449 A | 9/1985 | Whitehead | |
| 4,588,258 A | 5/1986 | Hoopman | |
| 4,764,410 A | 8/1988 | Grzywinski | |
| 4,766,023 A | 8/1988 | Lu | |
| 4,775,219 A | 10/1988 | Appeldorn | |
| 4,782,893 A | 11/1988 | Thomas | |
| 4,791,540 A | 12/1988 | Dreyer | |
| 4,799,131 A | 1/1989 | Aho | |

(Continued)

FOREIGN PATENT DOCUMENTS

| | | |
|---|---|---|
| DE | 4340996 | 3/1995 |
| DE | 10308890 | 9/2004 |

(Continued)

OTHER PUBLICATIONS

U.S. Appl. No. 60/826,457, filed Sep. 21, 2006, titled: Thermally Conductive LED Assembly.

(Continued)

*Primary Examiner* — Howard Weiss
*Assistant Examiner* — Tifney Skyles
(74) *Attorney, Agent, or Firm* — Sandra K. Nowak

(57) ABSTRACT

A thermally conductive LED assembly is disclosed. The thermally conductive LED assembly includes an elongate conductor cable having a first conductor and a second conductor extending along a length of the elongate conductor cable and a thermally conducting and electrically insulating polymer layer disposed between first conductor and second conductor and a second electrically insulating polymer layer is disposed on the first conductor or second conductor. The electrically insulating polymer layer having a thermal impedance value in a range from 2.5 to 15 C.°-cm2/W and a plurality of light emitting diodes are disposed along the length of the elongate conductor cable. Each light emitting diode is in electrical communication with the first conductor and the second conductor.

13 Claims, 2 Drawing Sheets

(56) References Cited

U.S. PATENT DOCUMENTS

| | | |
|---|---|---|
| 4,846,922 A | 7/1989 | Benge |
| 4,883,341 A | 11/1989 | Whitehead |
| 4,984,144 A | 1/1991 | Cobb |
| 5,056,892 A | 10/1991 | Cobb |
| 5,094,788 A | 3/1992 | Schrenk |
| 5,122,902 A | 6/1992 | Benson |
| 5,122,905 A | 6/1992 | Wheatley |
| 5,122,906 A | 6/1992 | Wheatley |
| 5,138,488 A | 8/1992 | Szczech |
| 5,161,041 A | 11/1992 | Abileah |
| 5,175,030 A | 12/1992 | Lu |
| 5,183,597 A | 2/1993 | Lu |
| 5,217,794 A | 6/1993 | Schrenk |
| 5,254,388 A | 10/1993 | Melby |
| 5,269,995 A | 12/1993 | Ramanathan |
| 5,303,322 A | 4/1994 | Winston |
| 5,310,355 A | 5/1994 | Dannatt |
| 5,321,593 A * | 6/1994 | Moates .................... 362/249.05 |
| 5,353,154 A | 10/1994 | Lutz |
| 5,389,324 A | 2/1995 | Lewis |
| 5,450,285 A | 9/1995 | Schlemmer |
| 5,528,720 A | 6/1996 | Winston |
| 5,594,830 A | 1/1997 | Winston |
| 5,626,800 A | 5/1997 | Williams |
| 5,645,932 A | 7/1997 | Uchibori |
| 5,703,664 A | 12/1997 | Jachimowicz |
| 5,751,388 A | 5/1998 | Larson |
| 5,759,422 A | 6/1998 | Schmelzer et al. |
| 5,771,328 A | 6/1998 | Wortman |
| 5,783,120 A | 7/1998 | Ouderkirk |
| 5,793,456 A | 8/1998 | Broer |
| 5,808,794 A | 9/1998 | Weber |
| 5,818,627 A | 10/1998 | Perlo |
| 5,825,542 A | 10/1998 | Cobb |
| 5,825,543 A | 10/1998 | Ouderkirk |
| 5,828,488 A | 10/1998 | Ouderkirk |
| 5,840,405 A | 11/1998 | Shusta |
| 5,857,767 A * | 1/1999 | Hochstein .................... 362/294 |
| 5,858,139 A | 1/1999 | Ouderkirk |
| 5,867,316 A | 2/1999 | Carlson |
| 5,872,653 A | 2/1999 | Schrenk |
| 5,882,774 A | 3/1999 | Jonza |
| 5,908,874 A | 6/1999 | Fong |
| 5,917,664 A | 6/1999 | O'Neill |
| 5,919,551 A | 7/1999 | Cobb |
| 5,962,114 A | 10/1999 | Jonza |
| 5,965,247 A | 10/1999 | Jonza |
| 5,976,424 A | 11/1999 | Weber |
| 5,987,204 A | 11/1999 | Lee et al. |
| 5,991,077 A | 11/1999 | Carlson et al. |
| 5,999,239 A | 12/1999 | Larson |
| 6,005,713 A | 12/1999 | Carlson |
| 6,018,419 A | 1/2000 | Cobb |
| 6,025,897 A | 2/2000 | Weber |
| 6,031,665 A | 2/2000 | Carlson |
| 6,052,164 A | 4/2000 | Cobb |
| 6,057,961 A | 5/2000 | Allen |
| 6,080,467 A | 6/2000 | Weber |
| 6,088,067 A | 7/2000 | Willett |
| 6,088,159 A | 7/2000 | Weber |
| 6,088,163 A | 7/2000 | Gilbert |
| 6,091,547 A | 7/2000 | Gardiner |
| 6,101,032 A | 8/2000 | Wortman |
| 6,111,696 A | 8/2000 | Allen |
| 6,117,530 A | 9/2000 | Jonza |
| 6,122,103 A | 9/2000 | Perkins |
| 6,124,971 A | 9/2000 | Ouderkirk |
| 6,132,859 A | 10/2000 | Jolly |
| 6,140,707 A | 10/2000 | Plepys et al. |
| 6,141,149 A | 10/2000 | Carlson |
| 6,148,130 A | 11/2000 | Lee et al. |
| 6,153,508 A | 11/2000 | Harvey |
| 6,157,490 A | 12/2000 | Wheatley |
| 6,179,948 B1 | 1/2001 | Merrill |
| 6,208,466 B1 | 3/2001 | Liu |
| 6,210,785 B1 | 4/2001 | Weber |
| 6,246,010 B1 | 6/2001 | Zenner et al. |
| 6,256,146 B1 | 7/2001 | Merrill |
| 6,262,842 B1 | 7/2001 | Ouderkirk |
| 6,268,070 B1 | 7/2001 | Bergstresser et al. |
| 6,280,063 B1 | 8/2001 | Fong |
| 6,280,822 B1 | 8/2001 | Smith |
| 6,287,670 B1 | 9/2001 | Benson |
| 6,288,172 B1 | 9/2001 | Goetz |
| 6,296,927 B1 | 10/2001 | Jonza |
| 6,340,518 B1 | 1/2002 | Kitahara et al. |
| 6,346,298 B1 | 2/2002 | Takahashi et al. |
| 6,458,465 B1 | 10/2002 | Uchibori |
| 6,585,846 B1 | 7/2003 | Hanson et al. |
| 6,618,939 B2 | 9/2003 | Uchibori et al. |
| 6,752,505 B2 | 6/2004 | Parker |
| 6,762,510 B2 | 7/2004 | Fock et al. |
| 6,764,210 B2 | 7/2004 | Akiyama |
| 6,788,541 B1 | 9/2004 | Hsiung |
| 6,855,404 B2 | 2/2005 | Anderson et al. |
| 6,905,774 B2 | 6/2005 | Takahashi et al. |
| 6,916,544 B2 | 7/2005 | Moriyama et al. |
| 6,924,024 B2 | 8/2005 | Narui et al. |
| 6,969,189 B2 | 11/2005 | Lee |
| 6,974,229 B2 | 12/2005 | West |
| 6,976,779 B2 | 12/2005 | Ohtsuki |
| 6,988,666 B2 | 1/2006 | Appalucci et al. |
| 7,000,999 B2 | 2/2006 | Ryan, Jr. |
| 7,052,924 B2 | 5/2006 | Daniels et al. |
| 7,101,619 B2 | 9/2006 | Nishinaka et al. |
| 7,116,227 B2 | 10/2006 | Eckstein et al. |
| 7,119,685 B2 | 10/2006 | Eckstein et al. |
| 7,138,919 B2 | 11/2006 | Clare et al. |
| 7,175,736 B2 | 2/2007 | Sakayori |
| 7,665,883 B2 | 2/2010 | Matheson |
| 2002/0006040 A1 | 1/2002 | Kamada |
| 2002/0159019 A1 | 10/2002 | Pokorny |
| 2003/0063463 A1* | 4/2003 | Sloan et al. .................... 362/238 |
| 2003/0122844 A1* | 7/2003 | Mueller et al. .............. 345/589 |
| 2003/0211797 A1 | 11/2003 | Hill et al. |
| 2003/0222559 A1 | 12/2003 | Cok |
| 2004/0032727 A1 | 2/2004 | Cok |
| 2004/0090794 A1* | 5/2004 | Ollett et al. .................... 362/555 |
| 2004/0130515 A1 | 7/2004 | Chuang |
| 2004/0223328 A1 | 11/2004 | Lee |
| 2005/0002194 A1 | 1/2005 | Kikuchi |
| 2005/0024754 A1 | 2/2005 | Epstein |
| 2005/0161210 A1 | 7/2005 | Zhong et al. |
| 2005/0195341 A1 | 9/2005 | Koganezawa |
| 2005/0195588 A1 | 9/2005 | Kang |
| 2005/0207156 A1 | 9/2005 | Wang et al. |
| 2005/0212007 A1 | 9/2005 | Daniels |
| 2005/0214962 A1 | 9/2005 | Daniels et al. |
| 2005/0231935 A1 | 10/2005 | Kimmet |
| 2006/0202850 A1* | 9/2006 | Hefright et al. ......... 340/815.45 |
| 2006/0217690 A1 | 9/2006 | Bastin et al. |
| 2007/0216274 A1* | 9/2007 | Schultz et al. .................... 313/46 |
| 2008/0062688 A1 | 3/2008 | Aeling |
| 2008/0295327 A1 | 12/2008 | Aeling |
| 2009/0251917 A1 | 10/2009 | Wollner |
| 2010/0061093 A1 | 3/2010 | Janssen |

FOREIGN PATENT DOCUMENTS

| | | |
|---|---|---|
| DE | 20319650 | 5/2006 |
| DE | 202006006889 | 8/2006 |
| EP | 0142380 | 2/1990 |
| EP | 392847 | 10/1990 |
| EP | 1416219 | 4/1991 |
| EP | 1473978 | 11/2004 |
| GB | 2031796 | 4/1980 |
| JP | 56-063128 | 5/1981 |
| JP | 8-020851 | 3/1990 |
| JP | 3-039819 | 6/1991 |
| JP | 5-343847 | 12/1993 |
| JP | 07-254770 | 10/1995 |
| JP | 09-115323 | 5/1997 |
| JP | 10-215069 | 8/1998 |
| JP | 11-305699 | 11/1999 |

(56) References Cited

FOREIGN PATENT DOCUMENTS

| | | |
|---|---|---|
| JP | 2000-208938 | 7/2000 |
| JP | 2000-214803 | 8/2000 |
| JP | 2001/185761 | 7/2001 |
| JP | 2001-284504 | 10/2001 |
| JP | 2002-299694 | 10/2002 |
| JP | 2003-323141 | 11/2003 |
| JP | 2005-136288 | 5/2005 |
| JP | 2005/164952 | 6/2005 |
| JP | 2006-100397 | 4/2006 |
| JP | 2006/210537 | 8/2006 |
| KR | 10-1990-009091 | 12/1990 |
| KR | 10/2005/0060479 | 6/2005 |
| KR | 2005-100083 | 10/2005 |
| WO | WO 2006-010249 | 2/2006 |
| WO | WO 2006-098799 | 9/2006 |
| WO | WO 2008-033720 | 3/2008 |

OTHER PUBLICATIONS

Biercuk, "Carbon nanotube composites for thermal management", Applied Physics Letters, Apr. 2002, vol. 80, No. 15, pp. 2767-2769.

Extended European Search Report for 08755104.0 completed Jun. 9, 2011, 6 pages.

International Search Report for PCT/US2006/008781, mailed Mar. 8, 2006, 4 pages.

International Search Report for PCT/US2007/077844, mailed Jan. 8, 2008, 2 pages.

International Search Report for PCT/US2007/078473, mailed Jan. 29, 2008, 2 pages.

International Search Report for PCT/US2008/062851, mailed Sep. 12, 2008, 3 pages.

* cited by examiner

THERMALLY CONDUCTIVE LED ASSEMBLY

CROSS-REFERENCE TO RELATED APPLICATIONS

This application claims the benefit of U.S. Provisional Application No. 60/826,457, filed Sep. 21, 2006, which is incorporated by reference herein.

BACKGROUND

The present disclosure relates generally to thermally conductive LED assemblies.

Light emitting diodes (LEDs) are small solid state light emitting devices that are finding many applications as illumination sources because of their rugged design and long lifetime. However, due to the small size of the LED devices, when they are operated at maximum power, they can generate considerable heat in a small, localized area. As the operating temperature of these LEDs rise, the performance and life expectancy of the LEDs degrade due to elevated temperature effects.

SUMMARY

This disclosure describes thermally conductive LED assemblies. The disclosure herein allows for enhanced operation and performance of LEDs that create a large amount of heat by allowing this heat to be removed from the local area of each LED. This heat can be removed, for example, by radiation or conduction. In this way, LEDs operating at maximum power provide maximum light output and operate to expected lifetimes. In addition, the assemblies described herein can allow for more high power LEDs to be operated along a flexible cable than with conventional wiring systems because such assemblies can dissipate heat effectively.

In one aspect, the present disclosure provides a thermally conductive LED assembly that includes an elongate conductor cable having a first conductor and a second conductor extending along a length of the elongate conductor cable and a thermally conducting and electrically insulating polymer layer disposed between first conductor and second conductor and a second electrically insulating polymer layer is disposed on the first conductor or second conductor. The electrically insulating polymer layer having a thermal impedance value in a range from 2.5 to 15 C.°-cm2/W and a plurality of light emitting diodes are disposed along the length of the elongate conductor cable. Each light emitting diode is in electrical communication with the first conductor and the second conductor.

In another aspect, the present disclosure provides a method of forming a thermally conductive LED assembly that includes disposing a thermally conductive and electrically insulating polymer layer between a first conductor and second conductor and disposing a second electrically insulating polymer layer on the first conductor or second conductor to form a length of an elongate conductor cable and placing a plurality of LEDs on the length of elongate conductor cable. The thermally conductive and electrically insulating polymer layer having a thermal impedance value in a range from 2.5 to 15 C.°-cm2/W and each LED is in electrical connection with the first conductor and the second conductor to form a thermally conductive LED assembly.

These and other aspects of the thermally conductive LED assembly according to the subject disclosure will become readily apparent to those of ordinary skill in the art from the following detailed description together with the drawings.

BRIEF DESCRIPTION OF THE DRAWINGS

So that those having ordinary skill in the art to which the subject invention pertains will more readily understand how to make and use the subject disclosure, exemplary embodiments thereof will be described in detail below with reference to the drawings, in which.

DETAILED DESCRIPTION

This disclosure describes thermally conductive LED assemblies. The disclosure herein allows for enhanced operation and performance of LEDs that create a large amount of heat by allowing this heat to be removed from the local area of each LED. This heat can be removed, for example, by radiation or conduction. In this way, LEDs operating at maximum power provide maximum light output and operate to expected lifetimes. In addition, the assemblies described herein can allow for more high power LEDs to be operated along a flexible cable than with conventional wiring systems because such assemblies can dissipate heat effectively.

Accordingly, the present disclosure is directed generally to thermally conductive LED assemblies, and particularly to thermally conductive LED assemblies that include an array of LEDs. While the present disclosure is not so limited, an appreciation of various aspects of the disclosure will be gained through a discussion of the examples provided below.

The following description should be read with reference to the drawings, in which like elements in different drawings are numbered in like fashion. The drawings, which are not necessarily to scale, depict selected illustrative embodiments and are not intended to limit the scope of the disclosure. Although examples of construction, dimensions, and materials are illustrated for the various elements, those skilled in the art will recognize that many of the examples provided have suitable alternatives that may be utilized.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Figure 1:
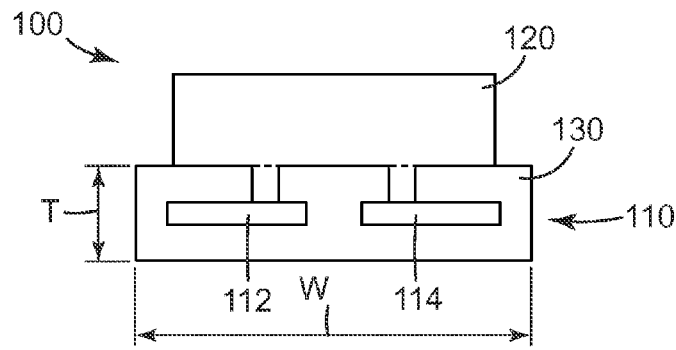
FIG. 1 is a schematic cross-sectional diagram of one illustrative thermally conductive LED assembly.
Figure 3:
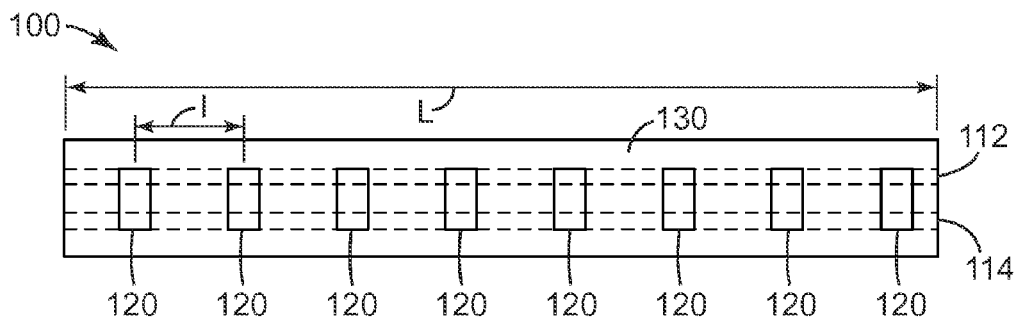
FIG. 3 is a schematic top view of FIG. 1.

FIG. 1 is a schematic cross-sectional diagram of one illustrative thermally conductive LED assembly 100. FIG. 3 is a schematic top view of FIG. 1. In many embodiments, the LED assemblies described herein are generally flexible flat cable assemblies. These flexible flat cable assemblies can be elastically deformed as desired. While the Figures show the LED generally disposed on the exterior of the flat cable, the LED may also be disposed within the flat cable such that the LED is recessed within the cable jacket any useful distance. In addition, the LED may be seated directly on the flat conductors or connected through one or more vias, as desired. In addition, the LEDs can be connected to the flat cable using any suitable technique, e.g., the techniques described in U.S. Pat. Nos. 5,987,204 (Lee et al.) and 6,148,130 (Lee et al.). The thermally conductive LED assembly can take any useful form such as a linear array of LEDs illustrated in FIG. 3, or an two dimensional array of LEDs illustrated in FIG. 5. The term elongate flat conductor cable refers both to the linear array of LEDs illustrated in FIG. 3 and the two dimensional array of LEDs illustrated in FIG. 5

In some embodiments, the assembly 100 includes an elongate flat conductor cable 110 having a first conductor 112 and a second conductor 114. In some embodiments, the first conductor 112 and second conductor 114 extend along a length of the elongate flat conductor cable 110 and are in side by side configuration. Although illustrated in FIG. 1 as including a flat cross-sectional shape, the first and second conductors 112, 114, can include any suitable cross-sectional shape, e.g., flat, circular, ovular, etc. The elongate flat conductor cable 110 can have any useful length L such as, for example, 0.5 to 10 meters, or from 0.5 to 3 meters, as desired.

The elongate flat conductor cable 110 linear array can have any useful thickness T and width W. In many embodiments, the elongate flat conductor cable 110 has an aspect ratio (W/T) of greater than 2, 3, 4, 5, 6, 7, 8, 9, or 10. In some embodiments, the elongate flat conductor cable 110 can have a thickness T in a range from 0.2 to 2 mm, or from 0.5 to 1 mm, and a width W in a range from 2 to 10 mm, or from 3 to 7 mm.

The first conductor 112 and the second conductor 114 can have an aspect ratio of greater than 2, 3, 4, 5, 6, 7, 8, 9, or 10. In some embodiments, the first conductor 112 and the second conductor 114 can have a thickness in a range from 0.1 to 0.5 mm, or from 0.1 to 0.3 millimeters and a width in a range from 0.2 to 2 mm, or from 0.5 to 1 mm. The first conductor 112 and the second conductor 114 can be formed from any useful conductive material such as, for example, a metal such as copper.

A plurality of elongate flat conductor cables 110 can be formed as a single structure or individually formed and then connected to form a single structure having a plurality of parallel elongate flat conductor cables 110. Thus, wide "mats" of parallel elongate flat conductor cables 110 can be utilized to illuminate an area as desired. Alternatively, a wide "mat" or web of elongate flat conductor cables 110 can be formed (e.g., extruded) and optionally separated along lines of weakness between the elongate flat conductor cables 110.

One or more LEDs 120 are disposed on the elongate flat conductor cable 110, and each LED 120 is in electrical connection with the first conductor 112 and the second conductor 114. In many embodiments, a plurality of LEDs 120 are disposed on the elongate flat conductor cable 110 along the length of the elongate flat conductor cable 110.

"Light emitting diode" or "LED" refers to a diode that emits light, whether visible, ultraviolet, or infrared. It includes incoherent encased or encapsulated semiconductor devices marketed as "LEDs", whether of the conventional or super radiant variety, and whether of the forward-emitting or side-emitting variety, the latter of which is often advantageous in display applications. If the LED emits non-visible light such as ultraviolet light, and in some cases where it emits visible light, it can be packaged to include an organic or inorganic phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant formed over an LED die and an associated reflector cup. The LED(s) 120 can operate via DC or AC current.

Figure 6:
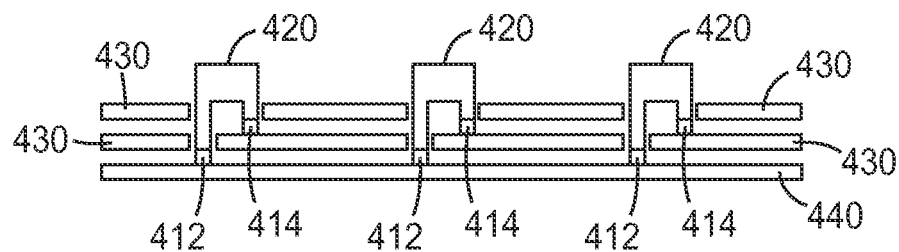
FIG. 6 is a schematic cross-sectional view of the thermally conductive LED assembly illustrated in FIG. 5 and taken along lines 6-6.

The elongate flat conductor cable 110 includes a polymeric jacket or film 130 surrounding or in contact with the first conductor 112 and the second conductor 114. The polymeric film 130 is electrically insulating and thermally conductive. The polymeric film 130 can have a thermal impedance value in a range from 2.5 to 15 C.$^\circ$-cm$^2$/W. In many embodiments, the polymeric film 130 is formed from a suitable polymer and a thermally conductive and electrically insulating filler material or particles. The thermally conductive and electrically insulating filler material or particles can be present in the polymeric film 130 in any useful amount such as, for example, 5 to 75 wt %, or from 10 to 50 wt %. The polymeric film 130 can be a monolithic element as illustrated in FIG. 1 or it can be a plurality of layers disposed about the first conductor and the second conductor as illustrated in FIG. 6.

The polymeric film 130 can include any suitable polymer or polymers, e.g., polyesters, polyurethanes, fluoropolymers, silicones and other cable jacketing materials. In some embodiments, the polymer includes polybutylene terephthalate (PBT), thermoplastic polyurethane (TPU), polyvinyl chloride (PVC), Teflon, Tefzel, and/or silicone.

Thermally conductive and electrically insulating fillers or particles include, for example, titanium dioxide, boron nitride, single walled carbon nanotubes and other inorganics. Single walled carbon nanotubes (see, e.g., M. J. Biercuk, et al., Appl. Phys. Letters, 80(15), 2767, April 2002) can offer enhanced thermal conductivity at loading levels of less than 2 wt % or less than 1 wt % or from 0.1 to 0.2 wt %.

In some embodiments the electrically insulating and thermally conductive polymeric jacket is provided as Light Enhancement Film 3635-100 (LEF) available from 3M Company, St. Paul, Minn.

A plurality of LEDs 120 are disposed on the elongate flat conductor cable 110 along the length of the elongate flat conductor cable 110 at an interval I such that enough space remains between each LED so that the heat generated by the LED is radiated or conducted away from the LED via the thermally conductive elongate flat conductor cable 110.

In many embodiments, a light reflective layer or material can be disposed on one or more of the major surfaces of the elongate flat conductor cable 110. In many embodiments, the light reflective layer is adjacent to the LED. In some embodiments, the light reflective layer is the electrically insulating and thermally conductive polymeric film 130. The light reflective layer or material can be a predominantly specular, diffuse, or combination specular/diffuse reflector, whether spatially uniform or patterned.

Any suitable light reflective material or materials may be used for the reflective layer, e.g., metal, polymeric, etc. Reflective materials may be mirror films, opaque films or other materials capable of light reflection. An example of suitable high reflectivity materials include Vikuiti™ Enhanced Specular Reflector (ESR) multilayer polymeric film available from 3M Company; a film made by laminating a barium sulfate-loaded polyethylene terephthalate film (2 mils thick) to Vikuiti™ ESR film using a 0.4 mil thick isooctylacrylate acrylic acid pressure sensitive adhesive, the resulting laminate film referred to herein as "EDR II" film; E-60 series Lumirror™ polyester film available from Toray Industries, Inc.; Light Enhancement Film 3635-100 (LEF) available from 3M Company, porous polytetrafluoroethylene (PTFE) films, such as those available from W. L. Gore & Associates, Inc.; Spectralon™ reflectance material available from Labsphere, Inc.; Miro™ anodized aluminum films (including Miro™ 2 film) available from Alanod Aluminum-Veredlung GmbH & Co.; MCPET high reflectivity foamed sheeting from Furukawa Electric Co., Ltd.; and White Refstar™ films and MT films available from Mitsui Chemicals, Inc. In some embodiments, the reflective layer or material is Vikuiti™ Enhanced Specular Reflector (ESR) multilayer polymeric film available from 3M Company, St. Paul, Minn. The reflective surfaces can direct or distribute light emitted from the LED 120 away from the elongate flat conductor cable 110.

Figure 2:
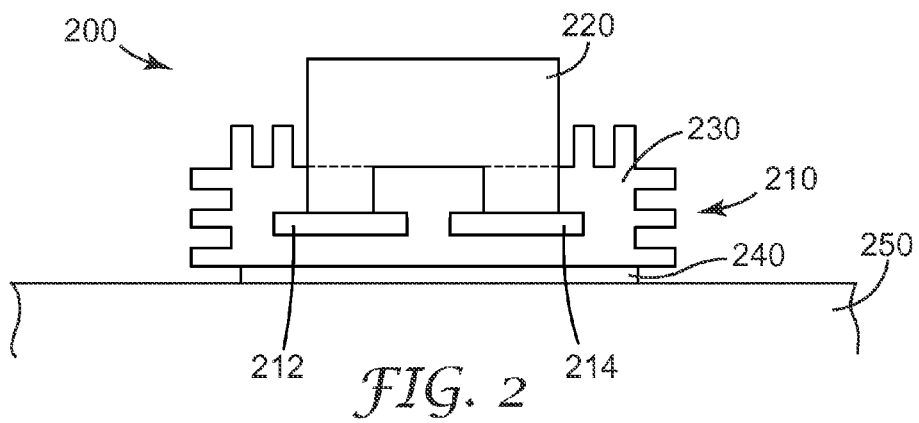
FIG. 2 is a schematic cross-sectional diagram of another illustrative thermally conductive LED assembly.

FIG. 2 is a schematic cross-sectional diagram of another illustrative thermally conductive LED assembly 200. The assembly 200 includes an elongate ribbed conductor cable 210 having a first conductor 212 and a second conductor 214. The first conductor 212 and the second conductor 214 can extend along a length of the elongate ribbed conductor cable 210 and be in side by side configuration. One or more LED(s) 220 are disposed on the elongate ribbed conductor cable 210 and each LED 220 is in electrical connection with the first conductor 212 and the second conductor 214. The elongate ribbed conductor cable 210 includes a polymeric film or jacket 230 surrounding the first conductor 212 and the second conductor 214. The LED 220, first conductor 212, second conductor 214, and polymeric jacket 230 are described above.

In this embodiment, the elongate ribbed conductor cable 210 includes a plurality of ribs or projections extending from one or more major surfaces of the elongate ribbed conductor cable 210. The ribs or projections provide increased surface area for heat to be radiated or conducted away from the LED and/or elongate ribbed conductor cable 210.

The elongate ribbed conductor cable 210 or elongate flat conductor cable 110 can be formed by any useful method such as, for example, lamination or polymer extrusion around the conductors.

A thermally conductive adhesive layer 240 can be disposed on the elongate ribbed conductor cable 210. In the illustrated embodiment, the thermally conductive adhesive layer 240 is disposed between the elongate ribbed conductor cable 210 and a substrate 250. The thermally conductive adhesive layer 240 can have a thermal impedance value in a range from 2.5 to 15 C.°-cm²/W. The thermally conductive adhesive layer 240 can be formed of any useful material such as, for example, polyacrylates, and epoxies. The thermally conductive adhesive layer 240 can be utilized with any of the thermally conductive LED assemblies described herein. The thermally conductive adhesive layer 240 can be a layer that is formed on the cable 210 or a tape that is positioned on the cable 210. Suitable tapes include thermally conductive adhesive tapes commercially available under the tradename 3M™ Thermally Conductive Adhesive Transfer Tape 8805, 8810, 8815, and 8820 available from 3M Company.

The thermally conductive adhesive layer 240 can conduct heat to the substrate 250, as desired. In some embodiments, the thermally conductive adhesive layer 240 can be a pressure sensitive adhesive. In these embodiments, the thermally conductive pressure sensitive adhesive layer 240 can include a release layer that protects the thermally conductive pressure sensitive adhesive layer 240 and is easily removed prior to application onto the substrate 250. Release liners are known in the pressure sensitive adhesive art and include, for example, silicone and fluoropolymer films.

In many embodiments, a reflective layer or material can be disposed on one or more of the surfaces of the elongate flat conductor cable 210. The reflective surfaces can direct or distribute light emitted from the LED 220 away from the elongate flat conductor cable 210.

Figure 4:
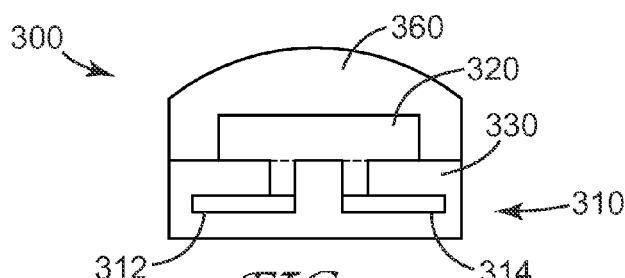
FIG. 4 is a schematic cross-sectional diagram of another illustrative thermally conductive LED assembly.

FIG. 4 is a schematic cross-sectional diagram of another illustrative thermally conductive LED assembly 300. The assembly 300 includes an elongate flat conductor cable 310 having a first conductor 312 and a second conductor 314. The first conductor 312 and the second conductor 314 can extend along a length of the elongate flat conductor cable 310 and be in side by side configuration. One or more LED(s) 320 are disposed on the elongate flat conductor cable 310, and each LED 320 is in electrical connection with the first conductor 312 and the second conductor 314. The elongate flat conductor cable 310 includes a polymeric jacket 330 surrounding the first conductor 312 and the second conductor 314. The elongate flat conductor cable 310, LED 320, first conductor 312, second conductor 314, and polymeric jacket 330 are described above.

In the illustrated embodiment, a lens feature 360 encapsulates the LED 320. In some embodiments, the lens feature 360 encapsulates the one or more LED 320 and at least a portion of the elongate flat conductor cable 310. In some embodiments, the lens feature 360 can be formed of any useful material that is thermally conductive and transparent to the light emitted by the LED 320. In many embodiments, the lens feature 360 is formed from a polymer and a thermally conductive filler, as described above. In one embodiment, the lens feature 360 is formed from a transparent polyurethane polymer and a thermally conductive filler such as, for example, single walled carbon nanotubes.

In many embodiments, a reflective layer or material can be disposed on one or more of the surfaces of the of the elongate flat conductor cable 310. The reflective surfaces can direct or distribute light emitted from the LED 320 away from the elongate flat conductor cable 310.

Figure 5:
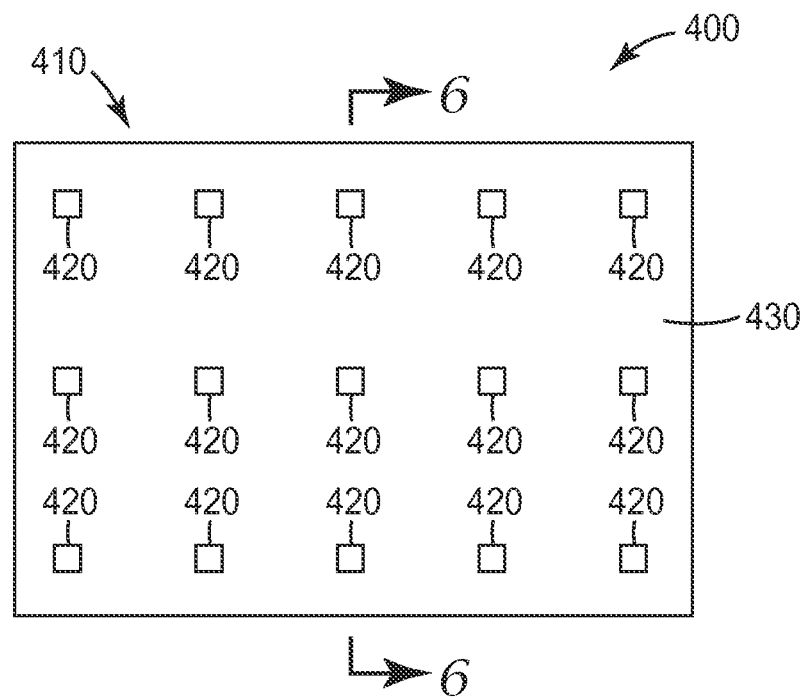
FIG. 5 is a schematic top view of another illustrative thermally conductive LED assembly.

FIG. 5 is a schematic top view of another illustrative thermally conductive LED assembly 400 and FIG. 6 is a schematic cross-sectional view of the thermally conductive LED assembly 400 illustrated in FIG. 5 and taken along lines 6-6. In these embodiments, the thermally conductive LED assembly 400 is illustrated as a two dimensional array having a uniform pattern of LEDs 420, however, it is understood that the thermally conductive LED assembly 400 can be a two dimensional array having a non-uniform pattern of LEDs 420. These thermally conductive LED assemblies 400 can be described as illumination mats or films that are often flexible.

The assembly 400 includes an elongate flat conductor cable 410 having a first conductor patterned grid layer 412 and a corresponding second conductor patterned grid layer 414. In many embodiments, the first conductor patterned grid layer 412 and the first conductor patterned grid layer 414 extend along a length and/or width of the elongate flat conductor cable 410. An electrically insulating and thermally conducting polymeric film 430 is disposed on and/or between the first conductor patterned grid layer 412 and the first conductor patterned grid layer 414. The polymeric film 430 is electrically insulating and thermally conductive, as described above. In many embodiments, the polymeric film 430 is disposed about the first conductor patterned grid layer 412 and the first conductor patterned grid layer 414 as layers 430. In some embodiments, a thermally conductive adhesive layer 440 is disposed on the elongate flat conductor cable 410, as described above.

In many embodiments, the first conductor patterned grid layer 412 and second conductor patterned grid layer 414 may be formed by a electrically conductive sheet such as copper or aluminum foil, for example, that may be continuous or patterned, for example by rotary die cutting, laser patterning, water jet cutting, or other cutting ways commercially available. These conductive patterned layers 412, 414 may be a separate layer, laminated onto the surface of the electrically insulating and thermally conducting polymeric film 430, or alternately, be positioned and secured between electrically insulating and thermally conducting polymeric films 430 and then bonded together. Circuit configurations may include busses in a grid pattern, or any other desired pattern.

In many embodiments, a light reflective layer or material can be disposed on one or more of the major surfaces of the assembly. In many embodiments, the light reflective layer is adjacent to the LED. In some embodiments, the light reflective layer is the electrically insulating and thermally conductive polymeric film. The light reflective layer or material can be a predominantly specular, diffuse, or combination specular/diffuse reflector, whether spatially uniform or patterned. The light reflective layer can be formed of any useful material, as described above.

The assembly 400 is a two dimensional array of LEDs (in the form of a film) that can have any useful thickness T and width W. In many embodiments, the elongate flat conductor cable 400 has a film-like aspect ratio (W/T) of greater than 25, 50, 100, 250, 500, 1000, 2000, 5000, or 10000. In some embodiments, the elongate flat conductor cable 400 can have a thickness T in a range from 0.1 to 5 mm, or from 0.2 to 3 mm, or from 0.5 to 2 mm, and a width W in a range from 25 to 3000 mm, or from 250 to 3000 mm, or a width of greater than 3000 mm.

This thermally conductive LED assembly 400 can be formed by any useful method such as a roll-to-roll process as described in U.S. patent application Ser. No. 11/756,905 filed on even date herewith and incorporated by reference.

Knowing the thermal impedance, conductor width and the like, of the LED assembly allows a user to place particularly sized LEDs onto the elongate flat conductor cable at an interval or pitch so that the heat emitted from the LED can be dissipated from the LED assembly without reducing the efficiency of the LEDs.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

The invention claimed is:

1. A thermally conductive LED assembly, comprising:
an elongate flexible conductor cable having a first conductor and a second conductor, both of which extend along a length of the elongate conductor cable;
a thermally conducting and electrically insulating layer surrounding or in contact with the first conductor and the second conductor, the thermally conducting and electrically insulating layer including thermally conducting particles dispersed in a polymeric binder and having a thermal impedance value in a range from 2.5 to 15 C.°-cm$^2$/W;
a plurality of light emitting diodes disposed along the length of the elongate flexible conductor cable and each light emitting diode in electrical communication with the first conductor and the second conductor;
wherein the plurality of light emitting diodes emit heat and the thermally conducting and electrically insulating layer dissipates the heat along the entire length of the flexible cable.

2. A thermally conductive LED assembly according to claim 1, wherein the elongate conductor cable has a thickness and a width and a width/thickness aspect ratio of greater than 5.

3. A thermally conductive LED assembly according to claim 1, wherein the plurality of light emitting diodes are disposed along the length and a width of the elongate conductor cable, forming a two dimensional array of light emitting diodes.

4. A thermally conductive LED assembly according to claim 1, wherein the first conductor or second conductor is a patterned grid layer.

5. A thermally conductive LED assembly according to claim 1, wherein the first conductor and second conductor are patterned grid layers.

6. A thermally conductive LED assembly according to claim 1, wherein the elongate conductor cable comprises thermally conducting single walled carbon nanotubes dispersed in a polymeric binder.

7. A thermally conductive LED assembly according to claim 1, further comprising a light reflective layer disposed on a major surface of the elongate conductor cable.

8. A thermally conductive LED assembly according to claim 1, wherein the elongate conductor cable comprises a lens disposed on the plurality of LEDs.

9. A thermally conductive LED assembly according to claim 1, wherein the elongate conductor cable comprises a lens disposed on the plurality of LEDs and the lens has a thermal impedance value in a range from 2.5 to 15 C.°-cm$^2$/W.

10. A thermally conductive LED assembly according to claim 1, further comprising a thermally conductive adhesive layer disposed on the elongate conductor cable, and the thermally conductive adhesive layer has a thermal impedance value in a range from 2.5 to 15 C.°-cm$^2$/W.

11. A thermally conductive LED assembly of claim 1, wherein the thermally conducting and electrically insulating layer is one of a monolithic element or includes a plurality of layers.

12. A thermally conductive LED assembly of claim 1, further comprising:
   projections or fins extending away from a major surface of the elongate conductor cable.

13. A thermally conductive LED assembly of claim 10, further comprising:
   a release liner disposed on the thermally conductive adhesive layer.

* * * * *